(12) United States Patent
Sun et al.

(10) Patent No.: US 7,009,287 B2
(45) Date of Patent: Mar. 7, 2006

(54) CHIP ON PHOTOSENSITIVE DEVICE PACKAGE STRUCTURE AND ELECTRICAL CONNECTION THEREOF

(75) Inventors: Cheng-Kuang Sun, Hsinchu (TW); Kuang-Chih Cheng, Linnei (TW); Kuang-Shin Lee, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/791,325

(22) Filed: Mar. 1, 2004

(65) Prior Publication Data

US 2005/0189624 A1    Sep. 1, 2005

(51) Int. Cl.
*H01L 23/02* (2006.01)
*H01L 23/34* (2006.01)

(52) U.S. Cl. ..................... 257/686; 257/723; 257/777

(58) Field of Classification Search ................ 257/686, 257/723, 777
See application file for complete search history.

(56) References Cited

U.S. PATENT DOCUMENTS 6,710,376 B1 * 3/2004 Worley ..................... 257/92

* cited by examiner

*Primary Examiner*—Hung Vu
(74) *Attorney, Agent, or Firm*—J.C. Patents

(57) ABSTRACT

A chip on photosensitive device package structure is provided. The package mainly comprises a photosensitive device, a transparent plate and a chip. The photosensitive device has an illumination area and a non-illumination area. The transparent plate has a first surface and a corresponding second surface. The transparent plate is set over the photosensitive device with the first surface covering both the illumination area and the non-illumination area. The chip is set on the second surface of the transparent plate above the non-illumination area of the photosensitive device.

16 Claims, 1 Drawing Sheet

CHIP ON PHOTOSENSITIVE DEVICE PACKAGE STRUCTURE AND ELECTRICAL CONNECTION THEREOF

BACKGROUND OF THE INVENTION

1. Field of the Invention

The present invention relates to a package structure. More particularly, the present invention relates to a chip on photosensitive device package structure and electrical connection thereof.

2. Description of Related Art

Charge coupled device (CCD) is one of the most common image sensors. The advantages of CCD include high dynamic range, low dark current and relatively mature development. However, CCD is rather expensive to produce due to many special fabrication processes and also the use a high driving voltage by the CCD incurs higher power comsumption. Furthermore, CCD do not allow random accessing of the image points.

In contrast, complementary metal-oxide-semiconductor (CMOS) image sensors has high quantum efficiency, low read-out noise, high dynamic range and random accessing capacity. Furthermore, the fabrication of CMOS image sensors is compatible with other CMOS processes. Hence, it is fairly easy to fabricate other control circuits, analogue/digital converters and digital signal processing circuits on the same chip and produce a self-contained unit, the so-called system on a chip (SOC). In other words, the production cost of the CMOS image sensor as well as the power consumption and the pixel size of CMOS image sensors are reduced considerably. In recent years, CMOS image sensors has found many low-cost applications including the gradual replacement of high cost CCD.

Both the CCD image sensor or CMOS image sensor have an array of photodiodes located within an illumination area. The photodiode array is capable of receiving external image signals (or light intensity signals), converting the image signals into electrical signals and transmitting the electrical signal to a circuit substrate for further image processing. FIG. 1 is a schematic cross-sectional view of a conventional electrical package. As shown in FIG. 1, the electrical package 100 mainly comprises a circuit substrate 110, a photosensitive device 120, an image processing chip 130, and a non-volatile memory 140. The photosensitive device 120 is, for example, a CCD image sensor or a CMOS image sensor set on the upper surface of and electrically connected to the circuit substrate 110. To prevent impurities and microparticles from contaminating the illumination area 122 of the photosensitive device 120, a transparent plate 124 or transparent layer fabricated from glass is formed on the upper surface of the photosensitive device 120. In general, an external image or light has to penetrate through the transparent plates 124 in order to reach the illumination area 122 of the photosensitive device 120. Thereafter, the image signals are converted into electrical signals by the array of photodiodes (not shown) and the electrical signals are sent to the image-processing chip 130 via the circuit substrate 110 to extract information regarding the flux and degree of color saturation in each pixel of the photodiode array.

It should be noted that the image-processing chip 130 and the non-volatile memory 140 are set on the upper surface or the lower surface of the circuit substrate 110 and then electrically connected to the circuit substrate 110 in the conventional fabrication technique. However, with the image-processing chip 130 and the non-volatile memory 140 occupying some surface area of the circuit substrate 110, further increase in the level of integration of the electrical package through a miniaturization of the substrate 110 is impossible.

SUMMARY OF THE INVENTION

Accordingly, one objective of the present invention is to provide a chip on photosensitive device package structure. The chip is stacked on a non-illumination area of the photosensitive device so that the level of integration of the chip package can be increased.

A second objective of the present invention is to provide an electrical package structure with image-processing chips or other memory chips set on a non-illumination area of a photosensitive device so that the chip-supporting surface area on a circuit substrate can be reduced.

To achieve these and other advantages and in accordance with the purpose of the invention, as embodied and broadly described herein, the invention provides a chip on photosensitive device package structure. The package comprises a photosensitive device, a transparent plate and a chip. The photosensitive device has an illumination area and a non-illumination area. The transparent plate has a first surface and a corresponding second surface. The transparent plate is set on the photosensitive device with the first surface covering the illumination area and the non-illumination area. The chip is set on the second surface of the transparent plate above the non-illumination area to form a stacked-chip on photosensitive device package structure.

The present invention also provides an electrical package structure. The package comprises a circuit substrate, a photosensitive device, a transparent plate, a chip and some encapsulating material. The photosensitive device is set on the circuit substrate and electrically connected to the circuit substrate through a plurality of first conductive wires. Furthermore, the photosensitive device has an illumination area and a non-illumination area. The transparent plate has a first surface and a corresponding second surface. The transparent plate is set on the photosensitive device with the first surface covering the illumination area and the non-illumination area. The chip is set on the second surface of the transparent plate above the non-illumination area and electrically connected to the circuit substrate through a plurality of second conductive wires. The encapsulating material encloses the first conductive wires and the second conductive wires to form an electrical package structure.

According to the embodiment of present invention, the photosensitive device comprises an array of photodiodes set within the illumination area for receiving image signals. The non-illumination area of the photosensitive device is located at the periphery of the illumination area. In addition, the photosensitive device is a charge coupled device (CCD) image sensor or a complementary metal-oxide-semiconductor (CMOS) image sensor, for example.

With a transparent plate set on the photosensitive device for supporting chips or other memory devices, a smaller chip-supporting surface area is required in the circuit substrate. Consequently, surface area of the circuit substrate can be reduced to increase the level of integration of the electrical package.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE PREFERRED EMBODIMENTS

Figure 1:
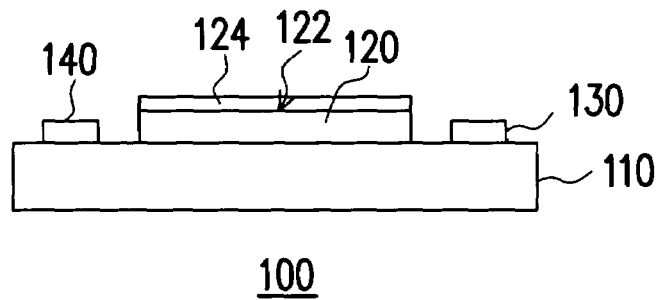
FIG. 1 is a schematic cross-sectional view of a conventional electrical package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
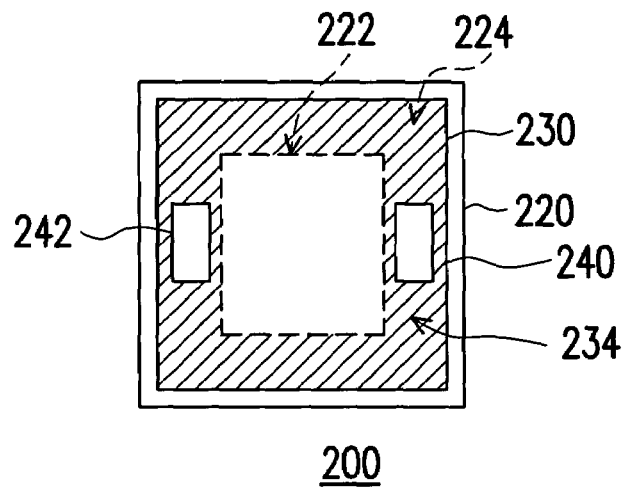
FIG. 2 is a top view of a chip on photosensitive device package structure according to one preferred embodiment of the present invention.

FIG. 2 is a top view of a chip on photosensitive device package structure according to one preferred embodiment of the present invention. As shown in FIG. 2, the package 200 essentially comprises a photosensitive device 220, a transparent plate 230 and a chip 240. The photosensitive device 220 has an illumination area (area enclosed by the dash lines) 222 and a non-illumination area (area with slash lines) 224. The transparent plate 230 is set over the photosensitive device 220 covering the illumination area 222 and the non-illumination area 224. The chip 240 is set on a surface 234 of the transparent plate 230 above the non-illumination area to form the chip-stacked on photosensitive device package 200.

In this embodiment, the photosensitive device 220 is a CCD image sensor or a CMOS image sensor, for example. However, both the CCD image sensor and the CMOS image sensor has an array of photodiodes (not shown) set within the illumination area 222 of the photosensitive device 220 for receiving external image signals (or light intensity signals) and converting the image signals into electrical signals. It should be noted that the back surface of an image-processing chip 240 is attached to the transparent plate 230 of the photosensitive device 220 using adhesive glue. The chip 240 is positioned on the peripheral region of the illumination area 222 (that is, within the non-illumination area 224). With the transparent plate 230 set over the photosensitive device 220, the surface 234 above the non-illumination area 224 provides a chip-supporting area for accommodating the chip 240 as well as other memory devices 242 without blocking any light incident upon the illumination area 222 (or the central area). Consequently, the circuit substrate needs to support fewer chips so that surface area of the circuit substrate can be reduced.

Figure 3:
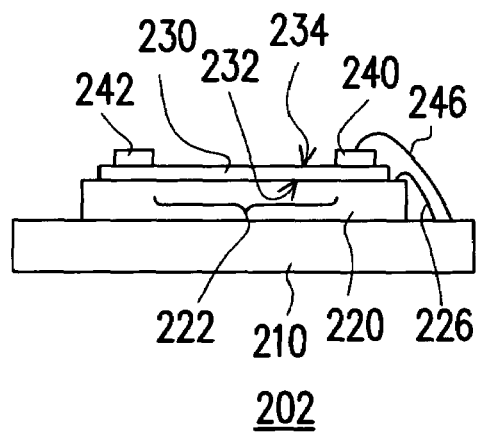
FIG. 3 is a schematic cross-sectional view of an electrical package according to one preferred embodiment of the present invention.

FIG. 3 is a schematic cross-sectional view of an electrical package according to one preferred embodiment of present invention. As shown in FIG. 3, the electrical package 202 essentially comprises a circuit substrate 210, a photosensitive device 220, a transparent plate 230 and a chip 240. The photosensitive device 220 is set on the circuit substrate 210 and electrically connected to the circuit substrate 210 through a plurality of conductive wires 226. The transparent plate 230 has a first surface 232 and a corresponding second surface 234. The transparent plate 230 is set over the photosensitive device 220. A first surface 232 of the transparent plate 230 covers the surface of the photosensitive device 220 to prevent any contaminants such as impurities or micro-particles from getting to the illumination area 222. The transparent plate 230 is fabricated using a glass or acrylic material, for example. Furthermore, an appropriate surface treatment or processing of the transparent plate 230 may be carried out to form an anti-reflection layer and/or an infrared cutting film on the surface of the transparent layer 230 for increasing incident flux and blocking out infrared light.

The chip 240 is set on the peripheral region of a second surface 240 of the transparent plate 230 and electrically connected to the circuit substrate 210 through a plurality of second conductive wires 246 (or a flexible circuit). Therefore, electrical signals can be transmitted from the circuit substrate 210 to the chip 240 so that image processing is performed to obtain the flux intensity and degree of color saturation for each pixel in the photodiode array. In this embodiment, the chip 240 and other memory devices 242 are stacked on the chip-supporting surface 234 of the transparent plate 230 instead of the circuit substrate 210. Hence, chip-supporting surface of the circuit board 210 can be reduced and the electrical package 202 can be miniaturized to a chip scale package integration level. In addition, the first conductive wires 226 and the second conductive wires 246 are enclosed using an encapsulating material (not shown) to provide a good electrical connection and prevent wire damages due to external impact.

Although a chip-stacked photosensitive device package is used as an illustration, the present invention can be applied to other package structures such as light-emitting devices, photodiodes and liquid crystal display (LCD) panels. One major difference is that the chip converts the electrical signal submitted by the circuit substrate into image signals (or light intensity signals) representing each photodiode or liquid crystal pixel if the chip is a driving device. Similarly, because the chip is stacked on the chip-supporting surface of the transparent plate covering the light-emitting device rather than the circuit substrate, the chip-supporting surface of the circuit substrate can be reduced to increase the level of integration of the electrical package.

Accordingly, the chip on photosensitive device package structure of present invention mainly comprises a photosensitive device, a transparent plate and a chip. The photosensitive device has an illumination area and a non-illumination area. The transparent plate has a first surface and a second surface. The transparent plate is set over the photosensitive device such that the first surface of the transparent plate covers both the illumination area and the non-illumination area. The chip is positioned on the transparent plate above the non-illumination area to reduce circuit substrate area and produce an electrical package with a higher level of integration.

In summary, major advantages of the chip on photosensitive device package and electrical package according to the present invention are as follows.

1. Chips and other memory devices are positioned on the upper surface of the transparent plate rather than on the upper surface of the circuit substrate. Thus, the chip-supporting area of the circuit substrate can be reduced to permit a further miniaturization of the package.

2. With the chip set on the surface of the transparent plate above the non-illumination area of the photosensitive device, incident light is free to reach the illumination area. Furthermore, the package has good electrical connection.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip on photosensitive device package structure, comprising:
    a photosensitive device having an illumination area and a non-illumination area;
    a transparent plate having a first surface and a corresponding second surface, wherein the transparent plate is set on the photosensitive device with the first surface covering the illumination area and the non-illumination area; and
    a chip set on the second surface of the transparent plate only above the non-illumination area.

2. The package structure of claim 1, wherein the package further comprises a memory device set on the second surface of the transparent plate above the non-illumination area.

3. The package structure of claim 1, wherein the photosensitive device has an array of photodiodes positioned within the illumination area.

4. The package structure of claim 1, wherein the non-illumination area is located at the periphery of the illumination area.

5. The package structure of claim 1, wherein the photosensitive device comprises a charge coupled device (CCD).

6. The package structure of claim 1, wherein the photosensitive device comprises a complementary metal-oxide-semiconductor (CMOS) image sensor.

7. The package structure of claim 1, wherein material constituting the transparent plate comprises one of glass and acrylic material.

8. The package structure of claim 1, wherein the chip comprises a signal-processing chip.

9. An electrical package structure, comprising:
    a circuit substrate;
    a photosensitive device set on the circuit substrate and electrically connected to the circuit substrate through a plurality of first conductive wires, wherein the photosensitive device has an illumination area and a non-illumination area;
    a transparent plate having a first surface and a corresponding second surface, wherein the transparent plate is set on the photosensitive device with the first surface covering the illumination area and the non-illumination area; and
    a chip set on the second surface of the transparent plate only above the non-illumination area and electrically connected to the circuit substrate through a plurality of second conductive wires.

10. The electrical package structure of claim 9, wherein the package further comprises a memory device set on the second surface of the transparent plate above the non-illumination area.

11. The electrical package structure of claim 9, wherein the photosensitive device has an array of photodiodes set within the illumination area.

12. The electrical package structure of claim 9, wherein the non-illumination area is located at the periphery of the illumination area.

13. The electrical package structure of claim 9, wherein the photosensitive device comprises a charge coupled device (CCD).

14. The electrical package structure of claim 9, wherein the photosensitive device comprises a complementary metal-oxide-semiconductor (CMOS) image sensor.

15. The electrical package structure of claim 9, wherein material constituting the transparent plate comprises one of glass and acrylic material.

16. The electrical package structure of claim 9, wherein the chip comprises a signal-processing chip.

* * * * *